(12) United States Patent
Maeda

(10) Patent No.: US 10,217,782 B2
(45) Date of Patent: Feb. 26, 2019

(54) IMAGE PICKUP MODULE AND MANUFACTURING METHOD OF IMAGE PICKUP MODULE

(71) Applicant: OLYMPUS CORPORATION, Tokyo (JP)

(72) Inventor: Kazuya Maeda, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/783,157

(22) Filed: Oct. 13, 2017

(65) Prior Publication Data
US 2018/0040652 A1 Feb. 8, 2018

Related U.S. Application Data

(63) Continuation of application No. PCT/JP2015/061428, filed on Apr. 14, 2015.

(51) Int. Cl.
*H01L 27/146* (2006.01)
*H04N 5/225* (2006.01)

(52) U.S. Cl.
CPC .. *H01L 27/14618* (2013.01); *H01L 27/14683* (2013.01); *H04N 5/2257* (2013.01)

(58) Field of Classification Search
CPC ........ H01L 27/14618; H01L 27/14683; H04N 5/2257
USPC ......................................................... 257/433
See application file for complete search history.

(56) References Cited

U.S. PATENT DOCUMENTS

| 2011/0245608 A1 | 10/2011 | Takahashi et al. |
| 2015/0207965 A1* | 7/2015 | Fujimori ........... H01L 27/14618 |
| | | 348/65 |

FOREIGN PATENT DOCUMENTS

| JP | H06-178757 A | 6/1994 |
| JP | H10-33470 A | 2/1998 |
| JP | 2008-109378 A | 5/2008 |
| JP | 2011-224348 | 11/2011 |
| JP | 2014-75764 A | 4/2014 |
| WO | 2014/054419 A1 | 4/2014 |
| WO | WO2014054419 | * 4/2014 ........... H04N 5/2251 |

OTHER PUBLICATIONS

International Search Report dated Jun. 30, 2015 issued in PCT/JP2015/061428.

* cited by examiner

*Primary Examiner* — Vu A Vu
(74) *Attorney, Agent, or Firm* — Scully, Scott, Murphy & Presser, P.C.

(57) ABSTRACT

An image pickup module includes: an image pickup device provided with a plurality of electrode pads lined up on an inclined surface inclined at an acute first angle to a light receiving surface; and a flexible wiring board provided with a plurality of bond electrodes each bonded with each of the plurality of electrode pads of the image pickup device and lined up in parallel to an end side, and the image pickup module further includes a holding portion that is a triangular angle regulating portion extended from a side face of the wiring board, an angle of which formed by a first side and a second side is the first angle, and a resin member fixing the image pickup device and the wiring board, a relative angle of which is regulated to the first angle by the holding portion.

8 Claims, 6 Drawing Sheets

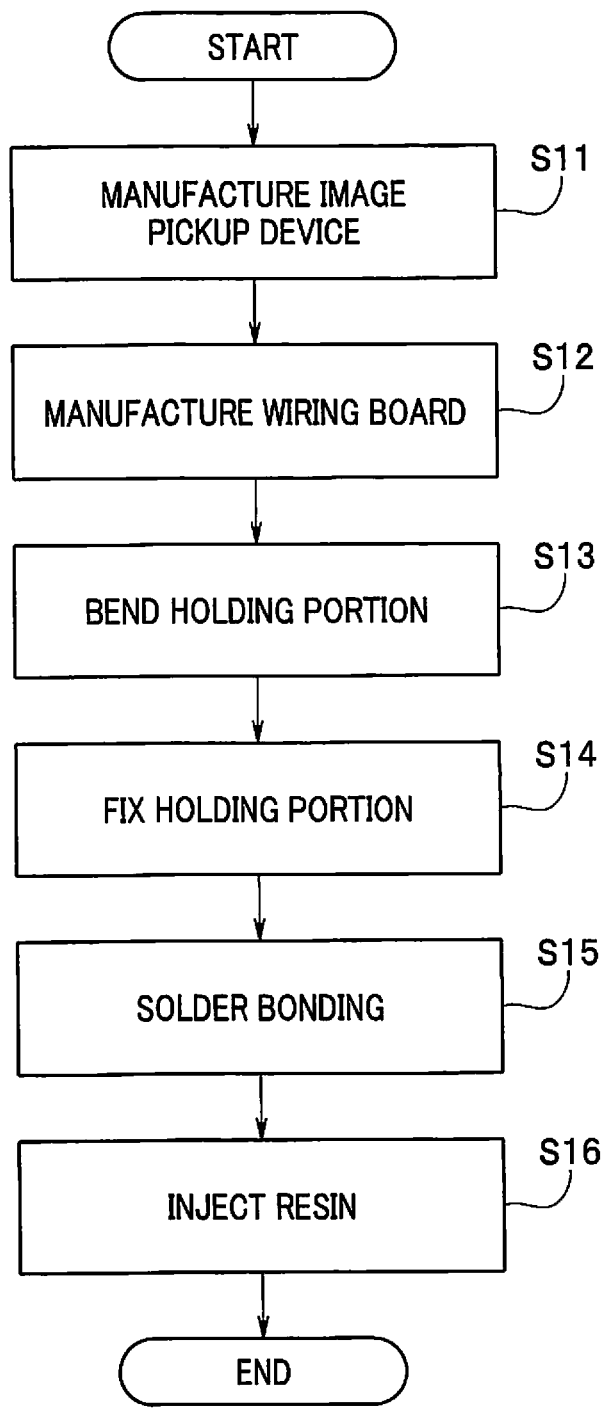

IMAGE PICKUP MODULE AND MANUFACTURING METHOD OF IMAGE PICKUP MODULE

CROSS REFERENCE TO RELATED APPLICATION

This application is a continuation application of PCT/JP2015/061428 filed on Apr. 14, 2015, the entire contents of which are incorporated herein by this reference.

BACKGROUND OF THE INVENTION

1. Field of the Invention

The present invention relates to an image pickup module including an image pickup device provided with a plurality of electrode pads lined up on an inclined surface inclined at an acute inclination angle to a light receiving surface, and a wiring board provided with a plurality of first bond electrodes bonded with each of the plurality of electrode pads of the image pickup device and lined up at an end portion, and a manufacturing method of the image pickup module.

2. Description of the Related Art

An image pickup module manufactured by a wafer level CSP technique is small-sized so that the image pickup module greatly contributes to diameter reduction of an endoscope, for example.

In a manufacturing method of the image pickup module of a wafer level CSP type, first, on a semiconductor wafer, a plurality of light receiving portions and a plurality of external electrodes connected with the respective light receiving portions are formed on a light receiving surface. A glass wafer is joined to the light receiving surface of the semiconductor wafer and a bond wafer is manufactured. A through wire reaching an opposite surface opposing the light receiving surface of the bond wafer is formed.

The light receiving surface of an image pickup device of an image pickup module obtained by cutting the bond wafer is covered with cover glass. However, since the light receiving portion is connected with an electrode of the opposite surface through the through wire, an electric signal can be transmitted and received.

Japanese Patent Application Laid-Open Publication No. 2014-75764 discloses an image pickup module 101 illustrated in FIG. 1. In the image pickup module 101, instead of a plurality of through wires, a plurality of wires are arranged in one through trench 110T.

The image pickup module 101 includes an image pickup device 110 to which cover glass 130 is joined by an adhesive layer 120, a wiring board 140, and a signal cable 150. For the image pickup device 110, on an inclined wall surface (inclined surface) 110SS of the through trench 110T, a plurality of electrode pads 113 respectively connected with external electrodes 113L of a light receiving surface 110SA are lined up. Note that the inclined surface 110SS is inclined at an acute first inclination angle θ1 to the light receiving surface 110SA of the image pickup device 110.

Each of the plurality of electrode pads 113 is bonded with a plurality of bond electrodes 141 lined up at an end portion of a main surface 140SA of the wiring board 140 through a bump 144. That is, for the wiring board 140, the main surface 140SA is inclined to an opposite surface 110SB of the image pickup device 110. Then, to the other end portion of the wiring board 140, the signal cable 150 is bonded.

SUMMARY OF THE INVENTION

An image pickup module of an embodiment of the present invention includes: an image pickup device including a light receiving surface where a light receiving portion is formed, an opposite surface opposing the light receiving surface, and an inclined surface inclined at an acute first angle to the light receiving surface, and provided with a plurality of electrode pads lined up on the inclined surface; a transparent member joined through an adhesive layer so as to cover the light receiving surface of the image pickup device; and a flexible wiring board arranged on a side of the opposite surface of the image pickup device and provided with a plurality of bond electrodes each bonded with each of the plurality of electrode pads of the image pickup device and lined up in parallel to an end side, and the image pickup module further includes a holding portion that is a triangular angle regulating portion extended from a side face of the wiring board, an angle of which formed by a first side and a second side is the first angle, and a resin member fixing the opposite surface of the image pickup device and a distal end portion of a main surface of the wiring board, a relative angle of which is regulated to the first angle by the holding portion.

Furthermore, a manufacturing method of the image pickup module of another embodiment is the manufacturing method of the image pickup module including an image pickup device including a light receiving surface where a light receiving portion is formed, an opposite surface opposing the light receiving surface, and an inclined surface inclined at an acute first angle to the light receiving surface, and provided with a plurality of electrode pads connected with the light receiving portion and lined up on the inclined surface, a transparent member joined through an adhesive layer so as to cover the light receiving surface of the image pickup device, and a flexible wiring board provided with bond electrodes bonded with each of the plurality of electrode pads of the image pickup device and lined up in parallel to an end side, and the wiring board includes a triangular holding portion extended from a side face, an angle of which formed by a first side and a second side is the first angle. The manufacturing method of the image pickup module includes: a process in which the holding portion is bent so as to be upright to a main surface of the wiring board; a process in which the holding portion is fixed in an upright state by a curable resin; a process in which each of the plurality of electrode pads is bonded with the bond electrodes; and a process in which the wiring board is fixed to the image pickup device by a resin member in a state in which the first side and the second side of the holding portion are in contact with the opposite surface.

BRIEF DESCRIPTION OF THE DRAWINGS

FIG. 4 is a flowchart for describing a manufacturing method of the image pickup module in the first embodiment;

DETAILED DESCRIPTION OF THE PREFERRED EMBODIMENTS

<First Embodiment>

Hereinafter, an image pickup module 1 in the first embodiment of the present invention will be described with reference to the drawings. Note that the drawings are schematic, and a relation between a thickness and a width of individual members and a ratio of the thicknesses of the respective members, a number of electrode pads, an array pit, and the like are different from the actual ones. In addition, even between the drawings, a part where the relation of dimensions or the ratio of each other is different is included. Further, for some configurations, for example illustrations of a silicon oxide layer on a surface of a silicon substrate, wires and the like, are omitted.

Figure 1:
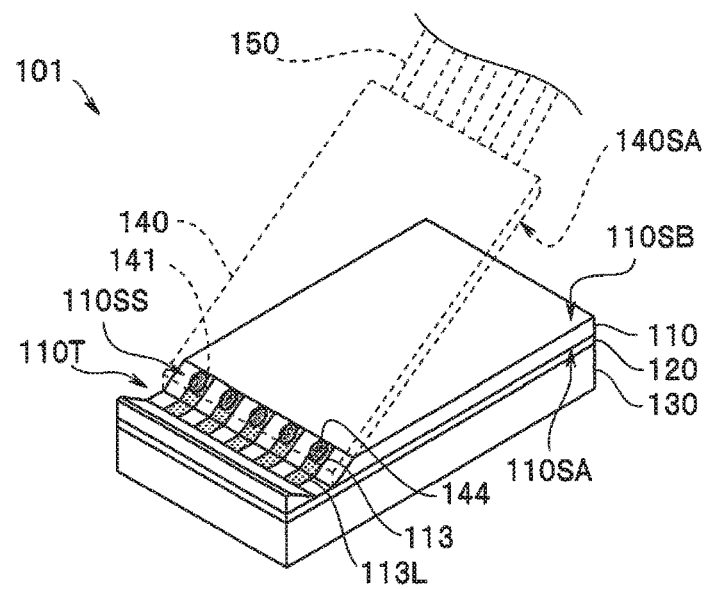
FIG. 1 is a perspective view of a conventional image pickup module.
Figure 2:
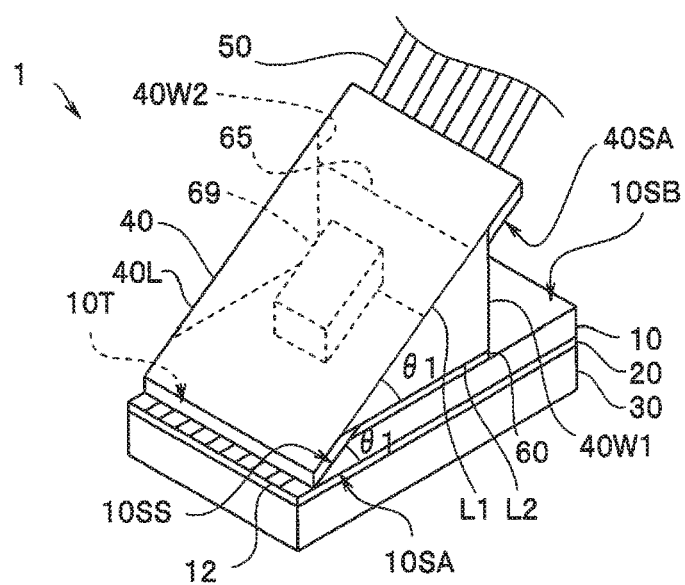
FIG. 2 is a perspective view of an image pickup module in a first embodiment.
Figure 3:
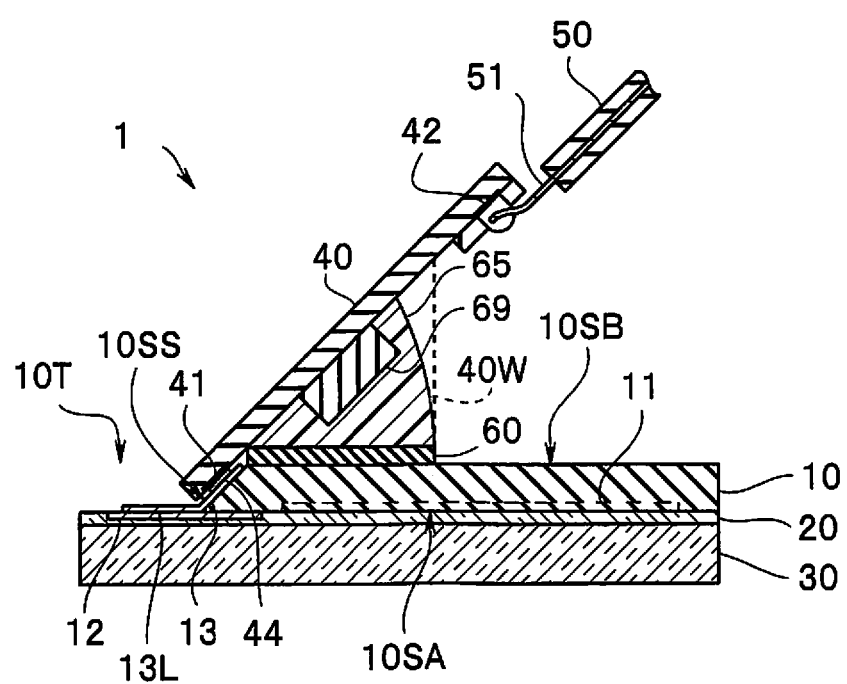
FIG. 3 is a sectional view of the image pickup module in the first embodiment.

As illustrated in FIG. 2 and FIG. 3, the image pickup module 1 includes an image pickup device 10 formed of a silicon substrate, cover glass 30 which is a transparent member, a wiring board 40, and a signal cable 50.

The image pickup device 10 has an almost same configuration as the configuration of the image pickup device 110 of an already described conventional image pickup module 101. An entire surface of a light receiving surface 10SA of the image pickup device 10 is covered with the cover glass 30 through an adhesive layer 20.

On a side of an opposite surface 10SB of the image pickup device 10, a notch 10T, a wall surface of which is an inclined surface 10SS inclined at a first angle θ1 to the light receiving surface 10SA, is provided. The first angle θ1 is an acute angle. As described later, a through trench formed by etching treatment from the side of the opposite surface 10SB of a bond wafer becomes the notch 10T by cutting of the bond wafer.

On a bottom surface of the notch 10T, a back surface of external electrodes 12 of the image pickup device 10 is exposed. Then, on the inclined surface 10SS, a plurality of electrode pads 13 electrically connected with the external electrodes 12 are lined up respectively. Therefore, the electrode pads 13 are electrically connected with a light receiving portion 11. Note that an extension portion of a wire 13L may be the electrode pads 13.

On the other hand, a plurality of bond electrodes 41 are lined up at an end portion of a main surface 40SA of the planar flexible wiring board 40, and bond electrodes 42 are lined up at the other end portion. The bond electrodes 41 are bonded with the electrode pads 13 through solder bumps 44. On the other hand, the bond electrodes 42 are connected with conductors 51 of the signal cable 50. The bond electrodes 41 and the bond electrodes 42 are electrically connected through an electronic component 69 mounted on the main surface 40SA or a wire (not illustrated).

Note that, in order to improve bond reliability, a bonding part of first bond electrodes 42 and the electrode pads 13 may be sealed with a sealing resin. However, it may not be easy to sufficiently guarantee mechanical strength by the sealing resin fixing only the bonding part.

In contrast, in the image pickup module 1, the wiring board 40 includes holding portions 40W1 and 40W2 extended respectively from side faces of a long side of a center wiring portion 40L, and a resin member 65 disposed in a space surrounded by the holding portions 40W1 and 40W2, the image pickup device 10 and the wiring portion 40L.

Note that the wiring board 40 includes the two holding portions 40W1 and 40W2, but may include only one of the holding portions 40W1 and 40W2. In addition, hereinafter, each of the two holding portions 40W1 and 40W2 is referred to as a holding portion 40W.

The holding portion 40W is a triangular angle regulating portion, an angle of which formed by a first side L1 and a second side L2 is a first angle θ1. The second side L2 of the holding portion 40W is in contact with a distal end portion of the opposite surface 10SB of the image pickup device 10 and is fixed by an adhesive layer 60. Note that the holding portion 40W is described as the triangular angle regulating portion here, however, a shape is not limited to a triangle, and as long as the angle formed by the two sides is the first angle θ1, may be a shape including four or more vertexes or the like and may be a quadrangle or a sector for example.

The holding portion 40W can stably regulate a relative angle of the image pickup device 10 and the wiring board 40 when a length of the second side L2 is 20% or more of a length of the image pickup device 10. In addition, when the length of the second side L2 is 80% or less of the length of the image pickup device 10, the cable 50 connected to the wiring board 40 can be arranged within a projection surface of the image pickup device 10.

For the opposite surface 10SB of the image pickup device 10 and the distal end portion of the main surface 40SA of the wiring board 40, the relative angle is regulated to the first angle θ1 by the holding portion 40W. For the image pickup device 10 and the wiring board 40, a relative position is fixed by the resin member 65 in addition to the adhesive layer 60.

In the image pickup module 1, the relative angle of the image pickup device 10 and the wiring board 40 are regulated to the first angle θ1 by the holding portion 40W and the image pickup device 10 and the wiring board 40 are fixed by the resin member 65. Therefore, for the image pickup module 1, mechanical strength between the image pickup device 10 and the wiring board 40 is high, a risk of a damage by handling is low, and also a final yield is sufficiently high.

<Manufacturing Method>

Next, along a flowchart illustrated in FIG. 4, the manufacturing method of the image pickup module 1 will be described. Note that the image pickup device 10 to which the cover glass 30 is joined is manufactured by cutting the bond wafer, however, description is given below as an individual image pickup device.

<Step S11> Manufacture Image Pickup Device

On the light receiving surface 10SA of the silicon substrate (image pickup device) 10, the light receiving portion 11 and the plurality of external electrodes 12 connected with the light receiving portion 11 by a wire (not illustrated) are formed by a known semiconductor manufacturing technique. The external electrode 12 is formed of a metal conductor of copper, aluminum or the like. The cover glass 30 (glass wafer) is joined to the light receiving surface 10SA through the adhesive layer 20. The adhesive layer 20 is formed of a transparent ultraviolet curing type resin for example. Then, on the opposite surface 10SB opposing the light receiving surface 10SA of the silicon substrate, an etching mask formed of photoresist for example is disposed. The etching mask includes a roughly rectangular opening in an etching area, that is, right above the external electrode 12.

Wet etching treatment using an alkali solution such as KOH or TMAH is performed for example to the silicon substrate from the side of the opposite surface 10SB, and a trench passing through the silicon substrate is formed. The trench is a wide via passing through the silicon substrate. When a bottom surface of the trench is cut along a longitudinal direction, the trench becomes the notch 10T.

The wall surface of the notch 10T formed by anisotropic etching becomes the inclined surface 10SS at an acute predetermined angle θ1 to the light receiving surface 10SA. Then, on the bottom surface of the notch 10T, the opposite surfaces of the plurality of external electrodes 12 are exposed. Note that a manufacturing method of the trench or the like is disclosed in details in Japanese Patent Application Laid-Open Publication No. 2009-016623 by the applicant.

The electrode pads 13 are disposed on the inclined surface 10SS. The electrode pads 13 are electrically connected with the external electrodes 12 by the wire 13L extended from the bottom surface of the notch 10T to the inclined surface 10SS.

Note that the notch 10T may be formed by dry etching, physical etching, mechanical grinding, or the like.

<Step S12> Manufacture Wiring Board

Figure 5A:
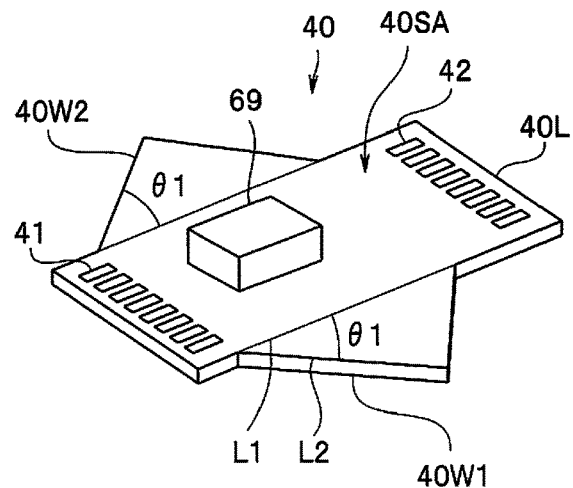
FIG. 5A is a perspective view for describing a manufacturing method of a wiring board of the image pickup module in the first embodiment.

As illustrated in FIG. 5A, from the side faces of both long sides of the wiring portion 40L at the center of the planar wiring board 40, the holding portions 40W1 and 40W2 are respectively extended. The holding portion 40W is the triangular angle regulating portion, the angle of which formed by the first side L1 and the second side L2 is the first angle θ1.

The wiring board 40 is a flexible wiring board, a base substance of which is polyimide for example. The wiring board 40 and the holding portion 40W are configured from the same base substance. The base substance of the wiring portion 40L and the holding portion 40W may be a non-flexible substrate formed of a glass epoxy resin or the like, however, for bending to be described later, at least a part to be bent, that is, a boundary area of the wiring portion 40L and the holding portion 40W, needs to be flexible.

Note that it is preferable that the wiring board 40 is a flexible substrate in order to be housed within the projection surface of the image pickup device 10. On the main surface 40SA of the wiring portion 40L, the electronic component 69 such as a chip capacitor or a chip inductor is mounted. Note that the electronic component may be mounted also on a main surface 40SB opposing the main surface 40SA.

<Step S13> Bend Holding Portion

Figure 5B:
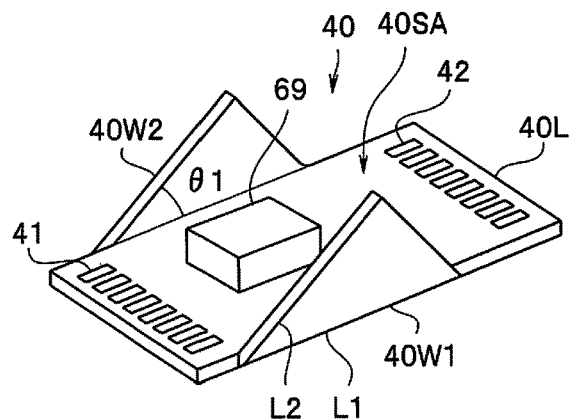
FIG. 5B is a perspective view for describing the manufacturing method of the wiring board of the image pickup module in the first embodiment.
Figure 5C:
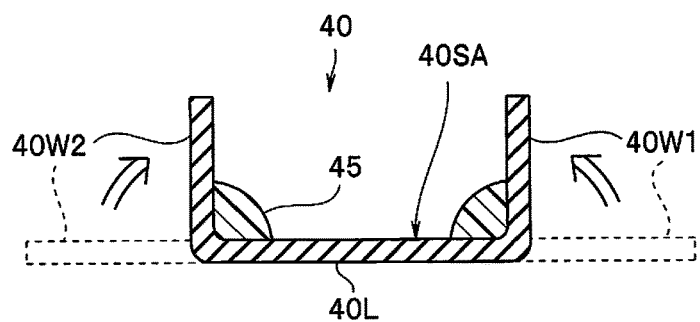
FIG. 5C is a sectional view for describing the manufacturing method of the wiring board of the image pickup module in the first embodiment.

As illustrated in FIG. 5B and FIG. 5C, the holding portions 40W1 and 40W2 are bent so as to be upright to the main surface 40SA of the wiring board 40. The planar wiring board 40 becomes a three-dimensional stereoscopic configuration body in the bending step. A width of the wiring board 40 including the holding portions 40W1 and 40W2 needs to be equal to or smaller than the width of the image pickup device 10 in a bent state.

<Step S14> Fix Holding Portion

As illustrated in FIG. 5C, the holding portions 40W1 and 40W2 are fixed in the upright state by a curable resin 45. As the curable resin 45, an ultraviolet curable type resin is preferable.

<Step S15> Bond

The second side L2 of the holding portion 40W of the wiring board 40 is joined to the distal end portion of the opposite surface 10SB of the image pickup device 10 through the adhesive layer 60. At the time, each of the plurality of bond electrodes 41 (solder bumps 44) lined up on the wiring board 40 is brought into contact with each of the plurality of electrode pads 13 lined up on the image pickup device 10.

When the solder bumps 44 are subjected to heating treatment, the electrode pads 13 are bonded with the bond electrodes 41 through the solder bumps 44.

Note that the wiring board 40 may be joined to the image pickup device 10 after the electrode pads 13 and the bond electrodes 41 are bonded with solder.

<Step S16> Inject Resin

The resin member 65 is injected to a space surrounded by the holding portions 40W1 and 40W2, the image pickup device 10 and the wiring portion 40L, and curing treatment is performed. The resin member 65 is a thermosetting type epoxy resin which is liquid in a non-cured state, for example.

Note that the electronic component 69 is mounted on the wiring board 40. Therefore, a surface of the electronic component 69 is covered with the resin member 65 on an inner side of the holding portion 40W, and protected.

For the image pickup device 10 manufactured by the above-described manufacturing method, for the image pickup module 1, the mechanical strength between the image pickup device 10 and the wiring board 40 is high, the risk of the damage by handling is low, and also the final yield is sufficiently high.

Note that, for the image pickup module 1, the wiring board 40 positioned on a rear side of the image pickup device 10 (on an opposite side of the cover glass) is entirely positioned in an area overlapping with the image pickup device 10 in a plane view of the image pickup device 10 from a thickness direction, that is, within the projection surface of the image pickup device 10. In particular, in a case that the wiring portion 40L of the wiring board 40 is flexible, even when the length of the wiring board 40 is long, the entire wiring board 40 can be arranged within the projection surface of the image pickup device 10 by being curved and deformed. Since the wiring board 40 is not projected to an outer side of an outer shape of the image pickup device 10, the image pickup module 1 has a narrow diameter.

Note that, in the image pickup module 1, the holding portions 40W1 and 40W2 are extended respectively from the side faces of both long sides of the wiring portion 40L at the center of the wiring board 40, however, the holding portion may be extended only from one side face. That is, there may be only one holding portion.

<Second Embodiment>

Next, an image pickup module 1A in the second embodiment and image pickup modules 1B to 1D in modifications of the second embodiment will be described. Note that, since the image pickup modules 1A to 1D are similar to the image pickup module 1 and have same effects, same signs are attached to components of same functions and description is omitted.

Figure 6:
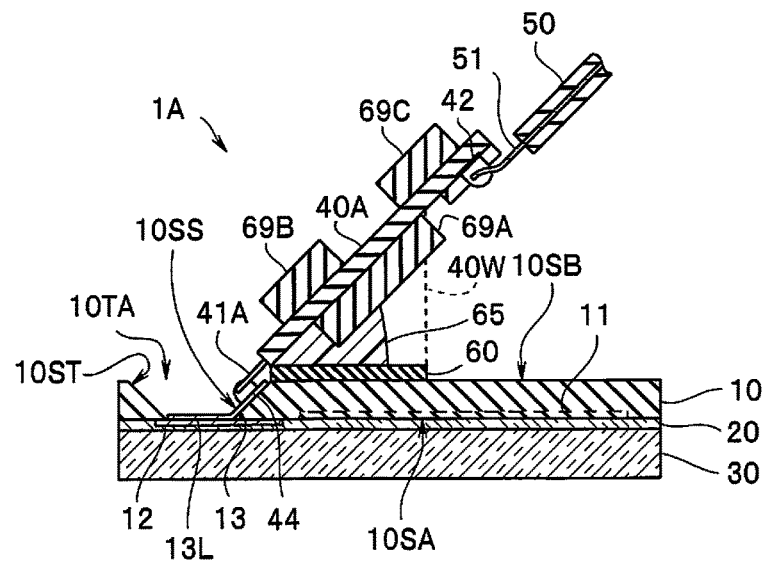
FIG. 6 is a sectional view of an image pickup module in a second embodiment.

As illustrated in FIG. 6, on an image pickup device 10A of the image pickup module 1A, similarly to the image pickup device 110 of the already-described conventional image pickup module 101, a through trench 10TA, both wall surfaces MS and 10ST of which are inclined surfaces, is formed. That is, a cutting position of the bond wafer is different from the cutting position for the image pickup device 10. However, a basic configuration of the image pickup device 10A is the same as the basic configuration of the image pickup device 10.

In addition, for a wiring board 40A of the image pickup module 1A, bond electrodes lined up on an end face are flying leads 41A. The flying leads 41A (referred to as outer leads in a lead frame) are formed of conductor wire from which an insulating base substance of the wiring board 40A is selectively removed.

The flying leads 41A can be easily bent, and also the solder bumps 44 can be directly heated without interposing the base substance of the wiring board 40A.

Therefore, the image pickup module 1A is manufactured more easily than the image pickup module 1.

Note that an electronic component 69A is mounted on the main surface 40SA of the wiring board 40A, and electronic components 69B and 69C are mounted also on the main surface 40SB. The electronic component 69A is large so that the electronic component 69A is projected from an area surrounded by the holding portions 40W1 and 40W2, and a part of the surface is covered with the resin member 65. In the image pickup module for which the holding portion regulates the relative angle of the wiring board and the image pickup device at a side portion of the wiring portion, the large electronic component can be mounted on the wiring board.

<Modifications of Second Embodiment>

FIG. 7A to FIG. 9B illustrate the wiring board of the image pickup module in the modifications of the second embodiment. Note that FIG. 7A to FIG. 9B display the wiring board extremely simply.

For wiring boards 40B to 40D in modifications 1 to 3, by bending the wiring board in a plane state many times like origami, a more highly functional solid body is manufactured.

<Modification 1>

Figure 7A:
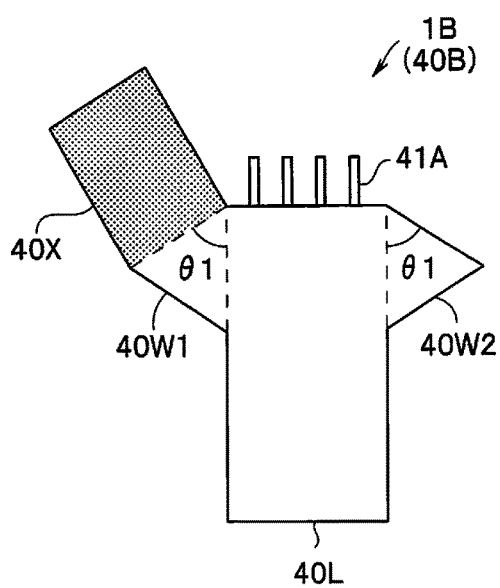
FIG. 7A is a top view for describing the manufacturing method of a wiring board of the image pickup module in a modification 1 of the second embodiment.

The wiring board 40B of the image pickup module 1B in the modification 1 illustrated in FIG. 7A includes an opposite surface joining portion 40X extended from one side of the holding portion 40W1.

Figure 7B:
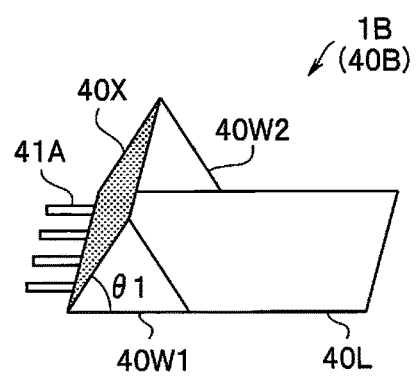
FIG. 7B is a perspective view of the wiring board of the image pickup module in the modification 1 of the second embodiment.

As illustrated in FIG. 7B, the opposite surface joining portion 40X is bent further from the holding portion 40W1, and connects the holding portion 40W2 and the holding portion 40W1. Note that an extension portion may be provided further from the opposite surface joining portion 40X and the extension portion may be bent and joined with the holding portion 40W2.

Though not illustrated, for the wiring board 40B, the opposite surface joining portion 40X is joined and fixed to the opposite surface 10SB of the image pickup device 10. Therefore, the relative angle of the image pickup device 10 and the wiring board 40B is more stably regulated.

<Modification 2>

Figure 8A:
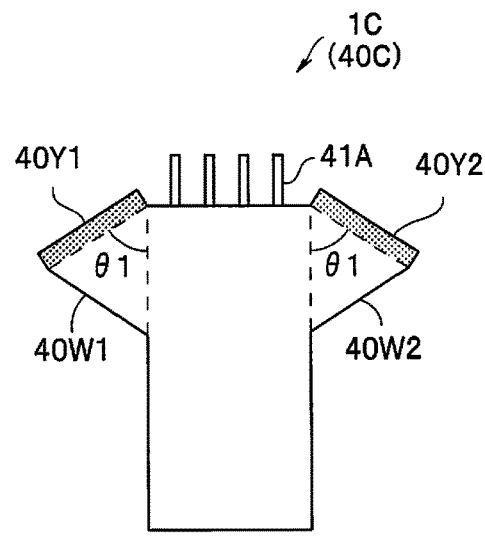
FIG. 8A is a top view for describing the manufacturing method of a wiring board of an image pickup module in a modification 2 of the second embodiment.
Figure 8B:
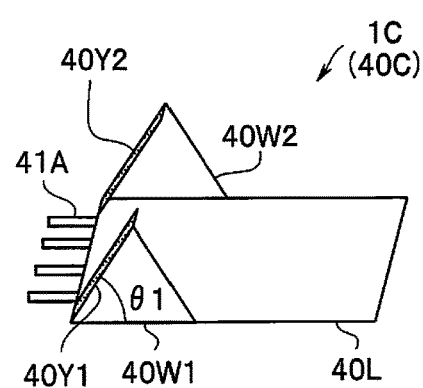
FIG. 8B is a perspective view of the wiring board of the image pickup module in the modification 2 of the second embodiment.

The wiring board 40C of the image pickup module 1C in the modification 2 illustrated in FIG. 8A and FIG. 8B includes an opposite surface joining portion 40Y1 extended from the holding portion 40W1 and an opposite surface joining portion 40Y2 extended from the holding portion 40W2.

Though not illustrated, for the wiring board 40C, the opposite surface joining portions 40Y1 and 40Y2 are joined and fixed to the opposite surface 10SB of the image pickup device 10. Therefore, the relative angle of the image pickup device 10 and the wiring board 40C is more stably regulated.

<Modification 3>

Figure 9A:
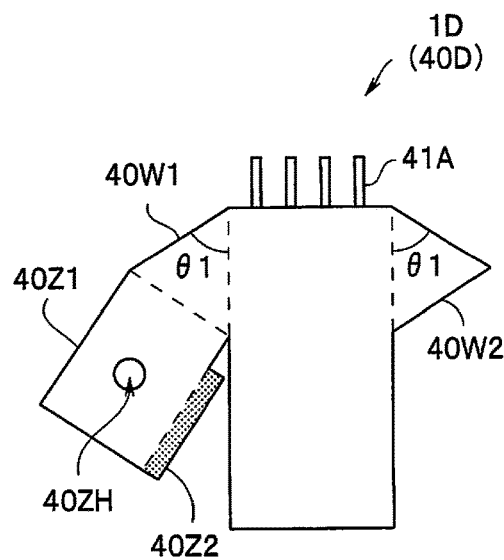
FIG. 9A is a top view for describing the manufacturing method of a wiring board of an image pickup module in a modification 3 of the second embodiment.
Figure 9B:
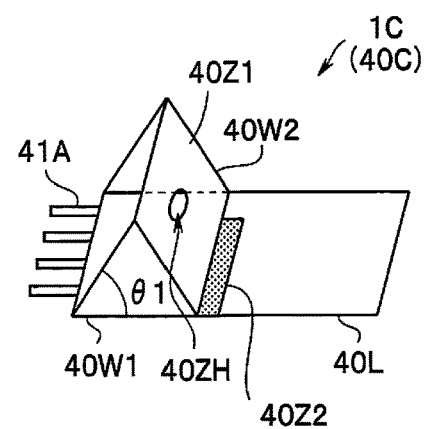
FIG. 9B is a perspective view of the wiring board of the image pickup module in the modification 3 of the second embodiment.

The wiring board 40D of the image pickup module 1D in the modification 3 illustrated in FIG. 9A and FIG. 9B includes a lid portion 40Z1 with a hole 40ZH extended from the holding portion 40W1, and a main surface joining portion 40Z2 extended from the lid portion 40Z1. The hole 40ZH is an injection port for injecting the resin member 65. The injection port may be formed at the holding portion 40W1 or the holding portion 40W2.

As illustrated in FIG. 9B, for the wiring board 40D, the main surface joining portion 40Z2 is joined and fixed to the main surface 40SB of the wiring portion 40L. Therefore, the holding portion 40W of the wiring board 40C is more stably maintained in the upright state.

Note that, for example, the lid portion 40Z1 and the main surface joining portion 40Z2 in the modification 3 may be disposed to the wiring board 40B in the modification 1.

That is, the wiring board in the modification includes at least one of the opposite surface joining portion 40X extended from the holding portion 40W and joined with the opposite surface 10SB and the main surface joining portion 40Z2 extended from the holding portion 40W and joined with the main surface 40SA.

Note that the wiring board in the modification has the similar effects even when used in combination with the image pickup device 10 in the first embodiment.

The present invention is not limited to the embodiments, the modifications and the like described above, and can be variously changed, modified, combined or the like without changing a subject matter of the present invention.

What is claimed is:

1. An image pickup module comprising:
    an image pickup device including a light receiving surface where a light receiving portion is formed, an opposite surface opposing the light receiving surface, and an inclined surface inclined at an acute first angle to the light receiving surface, and provided with a plurality of electrode pads lined up on the inclined surface;
    a transparent member joined through an adhesive layer so as to cover the light receiving surface of the image pickup device; and
    a flexible wiring board arranged on a side of the opposite surface of the image pickup device and provided with a plurality of bond electrodes each bonded with each of the plurality of electrode pads of the image pickup device and lined up in parallel to an end side,
    wherein the image pickup module further comprising a holding portion that is a triangular angle regulating portion extended from a side face of the wiring board, an angle of which formed by a first side and a second side is the first angle, and a resin member fixing the opposite surface of the image pickup device and a distal end portion of a main surface of the wiring board, a relative angle of which is regulated to the first angle by the holding portion; and
    the holding portion and the wiring board are configured from a same base substance.

2. The image pickup module according to claim 1, wherein the holding portion includes the angle regulating portion in plurality each extended from both side faces of the wiring board.

3. The image pickup module according to claim 1, wherein the wiring board includes at least one of an opposite surface joining portion extended from the holding portion and joined with the opposite surface and a main surface joining portion extended from the holding portion and joined with the main surface.

4. The image pickup module according to claim 1, wherein an electronic component is mounted on the main surface of the wiring board, and at least a portion of a surface of the electronic component is covered with the resin member on an inner side of the holding portion.

5. The image pickup module according to claim 1, wherein the holding portion is fixed in an upright state to the main surface of the wiring board by a resin different from the resin member.

6. The image pickup module according to claim 1, wherein the plurality of bond electrodes of the wiring board are flying leads.

7. A manufacturing method of an image pickup module including an image pickup device including a light receiving surface where a light receiving portion is formed, an opposite surface opposing the light receiving surface, and an inclined surface inclined at an acute first angle to the light receiving surface, and provided with a plurality of electrode pads connected with the light receiving portion and lined up on the inclined surface, a transparent member joined through an adhesive layer so as to cover the light receiving surface of the image pickup device, and a flexible wiring board provided with bond electrodes bonded with each of the plurality of electrode pads of the image pickup device and lined up in parallel to an end side, wherein the wiring board includes a triangular holding portion extended from a side face, an angle of which formed by a first side and a second side is the first angle, the manufacturing method of the image pickup module comprising:

a process in which the holding portion is bent so as to be upright to a main surface of the wiring board;

a process in which the holding portion is fixed in an upright state by a curable resin;

a process in which each of the plurality of electrode pads is bonded with the bond electrodes; and a process in which the wiring board is fixed to the image pickup device by a resin member in a state in which the first side and the second side of the holding portion are in contact with the opposite surface.

8. An image pickup module comprising:

an image pickup device including a light receiving surface where a light receiving portion is formed, an opposite surface opposing the light receiving surface, and an inclined surface inclined at an acute first angle to the light receiving surface, and provided with a plurality of electrode pads lined up on the inclined surface;

a transparent member joined through an adhesive layer so as to cover the light receiving surface of the image pickup device; and a flexible wiring board arranged on a side of the opposite surface of the image pickup device and provided with a plurality of bond electrodes each bonded with each of the plurality of electrode pads of the image pickup device and lined up in parallel to an end side, wherein the image pickup module further comprising a holding portion that is a triangular angle regulating portion extended from a side face of the wiring board, an angle of which formed by a first side and a second side is the first angle, and a resin member fixing the opposite surface of the image pickup device and a distal end portion of a main surface of the wiring board, a relative angle of which is regulated to the first angle by the holding portion; and the holding portion includes the angle regulating portion in plurality each extended from both side faces of the wiring board.

* * * * *